(12) United States Patent
Chang et al.

(10) Patent No.: US 6,794,686 B2
(45) Date of Patent: Sep. 21, 2004

(54) WHITE LIGHT SOURCE

(75) Inventors: Bill Chang, Hsin Chu (TW); Bily Wang, Hsin Chu (TW)

(73) Assignee: Harvatek Corporation, Hsinchu (TW)

( * ) Notice: Subject to any disclaimer, the term of this patent is extended or adjusted under 35 U.S.C. 154(b) by 0 days.

(21) Appl. No.: 10/464,111

(22) Filed: Jun. 19, 2003

(65) Prior Publication Data

US 2003/0227023 A1 Dec. 11, 2003

Related U.S. Application Data

(63) Continuation-in-part of application No. 10/162,780, filed on Jun. 6, 2002, now abandoned.

(51) Int. Cl.$^7$ ................................................ H01L 29/06
(52) U.S. Cl. ............................. 257/89; 257/13; 257/79; 257/918; 438/22; 438/24
(58) Field of Search .............................. 257/13, 79–103, 257/918; 438/22, 24, 25, 28, 29, 46, 47

(56) References Cited

U.S. PATENT DOCUMENTS

| 6,252,254 B1 | * | 6/2001 | Soules et al. .................. 257/89 |
| 6,417,019 B1 | * | 7/2002 | Mueller et al. ................ 438/29 |
| 2002/0070681 A1 | * | 6/2002 | Shimizu et al. ............. 315/246 |

* cited by examiner

Primary Examiner—David Nelms
Assistant Examiner—Long Tran
(74) Attorney, Agent, or Firm—Dennison, Schultz Dougherty & MacDonald

(57) ABSTRACT

A colorless light approaching that of white light in nature, is produced by using no more than two color LEDs covered with one or more layers of complementary color phosphorescent glue on an insulating substrate.

1 Claim, 8 Drawing Sheets

WHITE LIGHT SOURCE

This application is a continuation-in-part of application Ser. No. 10/162,780, filed Jun. 6, 2002, now abandoned.

BACKGROUND OF THE INVENTIO (1) Field of the Invention

This invention relates to light source, particularly to the use of multicolor light emitting diode (LED) light source to produce a white light.

(2) Brief Description of Related Art

FIG. 1A shows a prior art to produce a colorless white light. The light source uses three color LEDs to produce a white light. A red color LED R, a green color LED G, and a blue color LED B are mounted on a substrate 10, The three LEDs are then covered with a glue for protection.

FIG. 1B shows the color spectrum of such a light source. The red LED has a light spectrum with wavelength in the 580 nm–680 mm range and a peak at 640 nm. The green LED has a light spectrum with wavelength in the 480 nm–580 nm range and a peak at 530 nm. The blue LED has a light spectrum with wavelength in the 430 nm–530 nm range and a peak at 480 nm. The white light in nature has light spectrum ranging from 400–780 nm wavelength. The artificial white light source using the R, G, B LEDs has peaks at 640 nm, 530 nm and 480 nm wavelengths, but lacks light spectrum below 430 nm wavelength, around 500 nm wavelength, around 580 nm wavelength and above 680 nm wavelength. Therefore, the combination of three color LEDs does not reproduce a true colorless light.

SUMMAR OF THE INVENTION

An object of this invention is to produce a colorless light source having the same light spectrum as the white light in nature. Another object of this invention is to produce a white light source with broader light spectrum than using the three color R, G, B LEDs. Still another object of this invention is to lower the cost of reproducing colorless light than the cost of using three color R, G, B LEDs.

These objects are achieved by using only two color LEDs and coving them with color phosphorescent glue. Alternatively, a single color LED is covered with two kinds of colored phosphorescent glues.

DETAILED DESCRIPTION OF THE INVENTION

In recent years, the "red phosphorescent glue" (SrS:Eu) and the "green phosphorescent glue" ($SrGa_2S_4$:Eu) become popular. The cost is lower than the LED chips and the light spectrum is broader than a LED. These properties are utilized to produce a colorless light in the present invention.

Figure 1A:
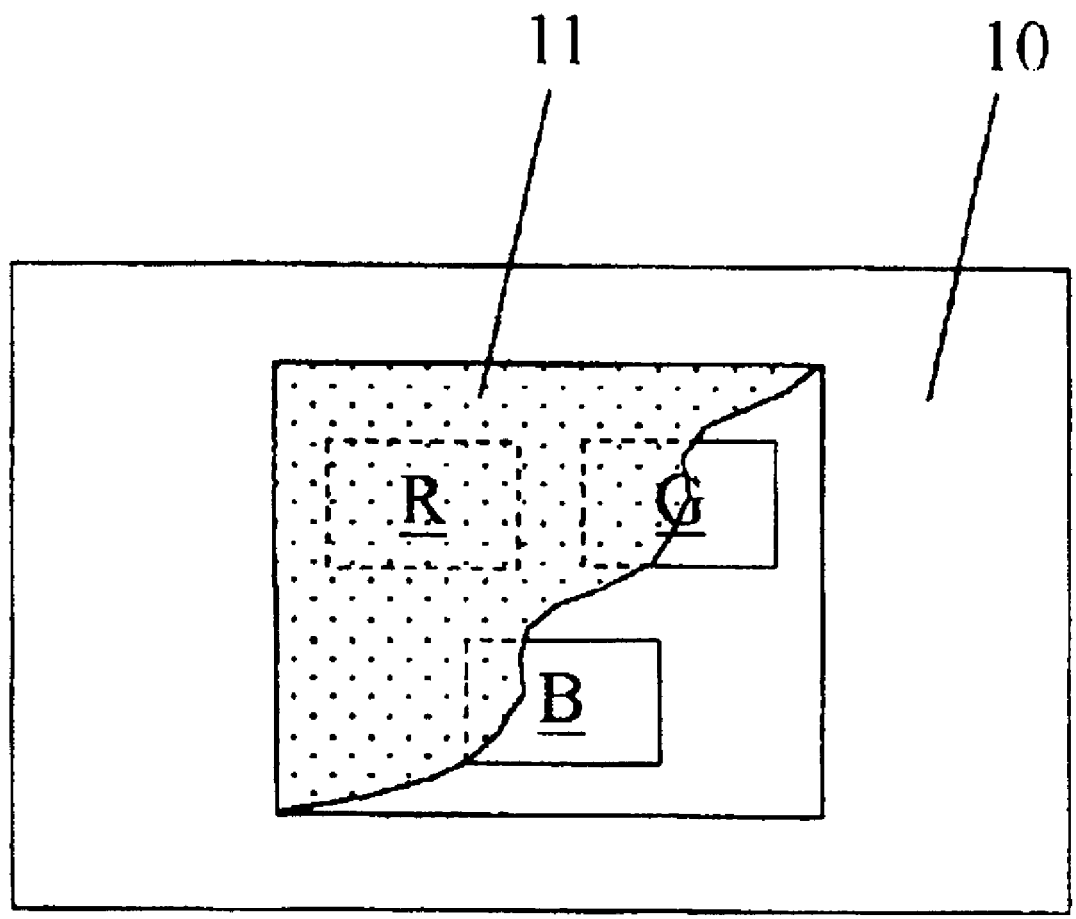
FIG. 1A shows a prior art light source using three color LEDs.
Figure 2A:
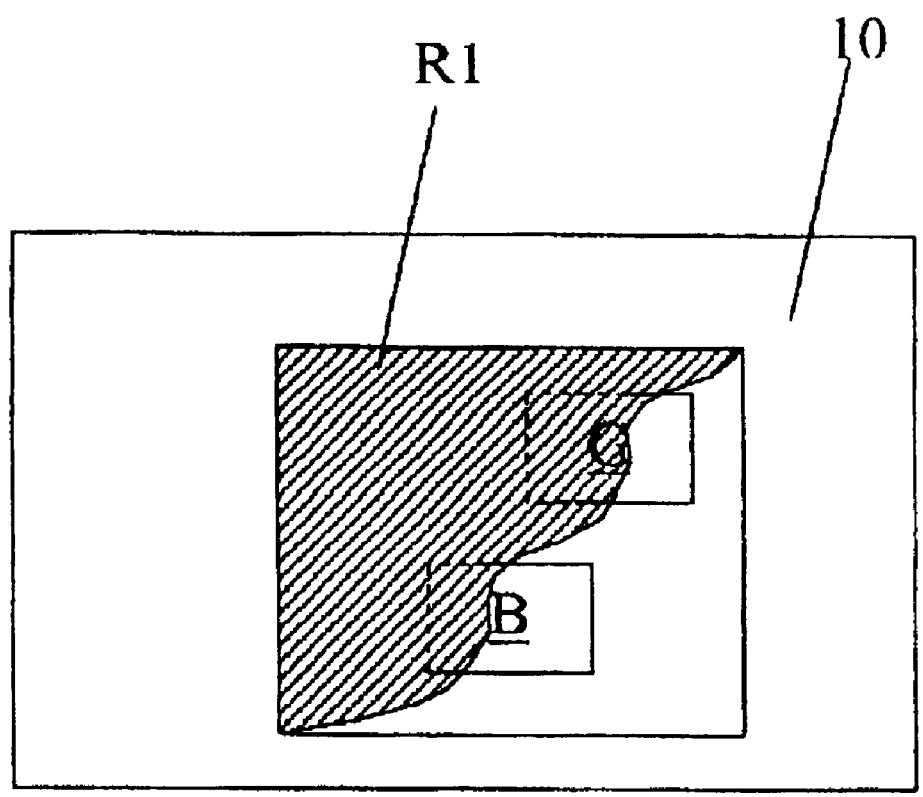
FIG. 2A shows a first embodiment of the present invention, using a green LED, a blue LED and a red phosphorescent glue.
Figure 2B:
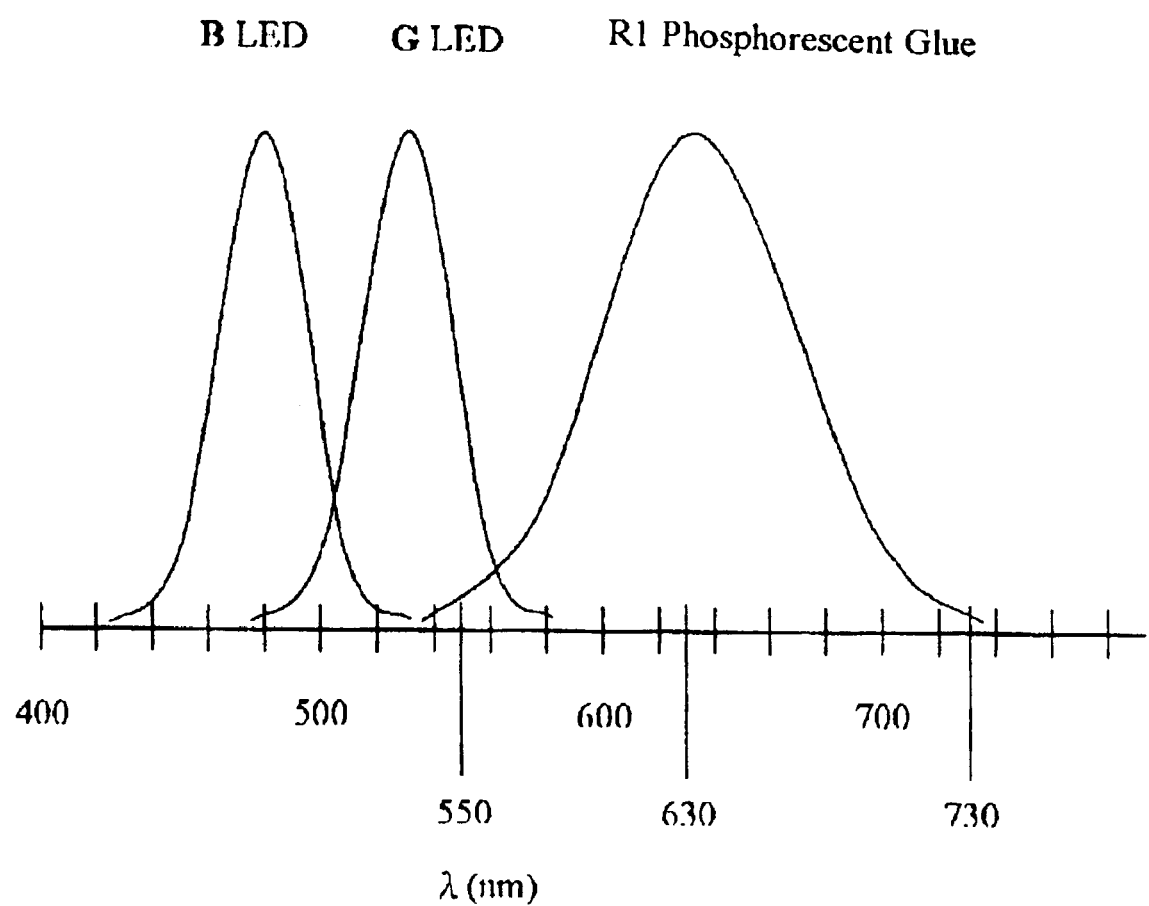
FIG. 2B shows the light spectrum of the light source shown in FIG. 2A.

FIG. 2A shows the first embodiment of the present invention. A green color LED G and a blue color LED B are mounted on an insulating substrate 10 such as a printed circuit board, to which the color LEDs can be coupled by wire-bonding or flip-chip technique. These two LEDs G and B are covered with a red phosphorescent glue R1. The light emitted from this structure is colorless as shown in the color spectrum in FIG. 2B. Note the red color spectrum of the red phosphorescent glue complements the colors of the LEDs and is considerably broader than the red LED spectrum response shown in FIG. 1A. Hence, the overall spectral response is also broader, approaching that of true natural white light.

Figure 1B:
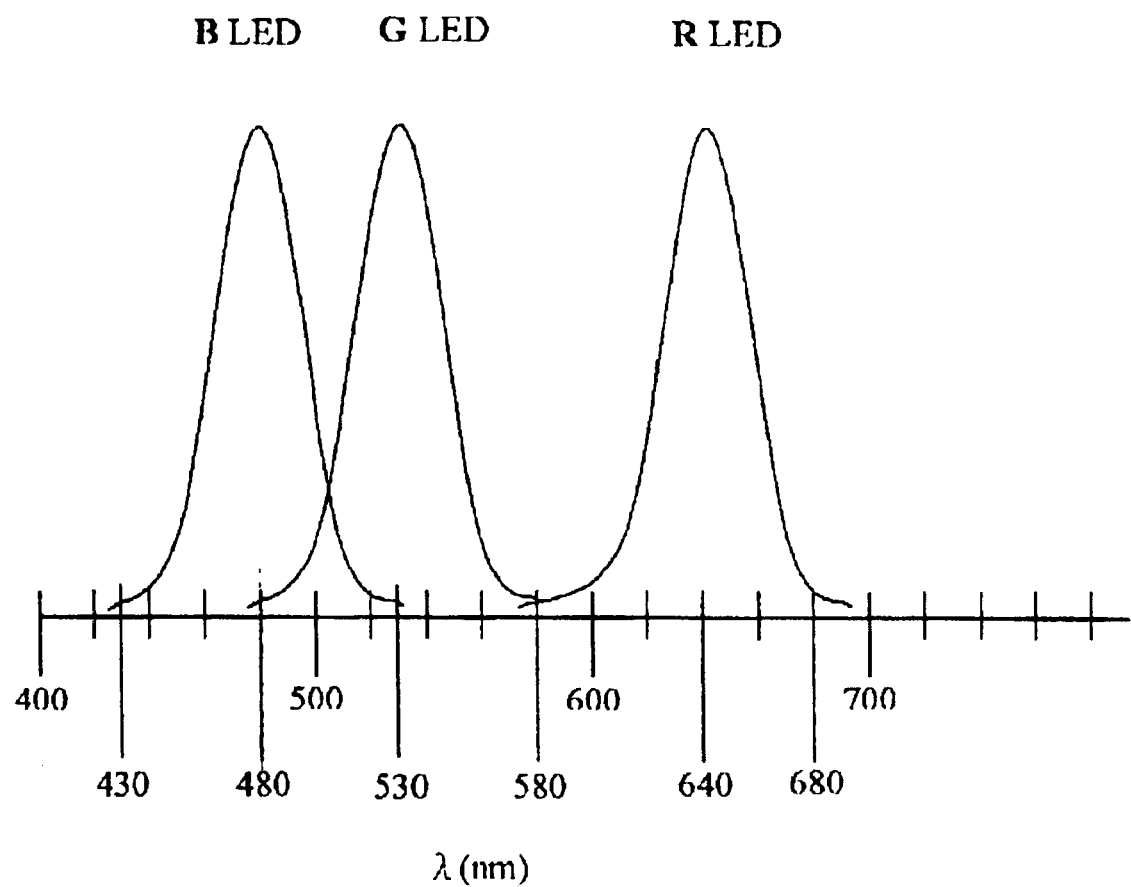
FIG. 1B shows the light spectrum of the 3-color LED light source.
Figure 3A:
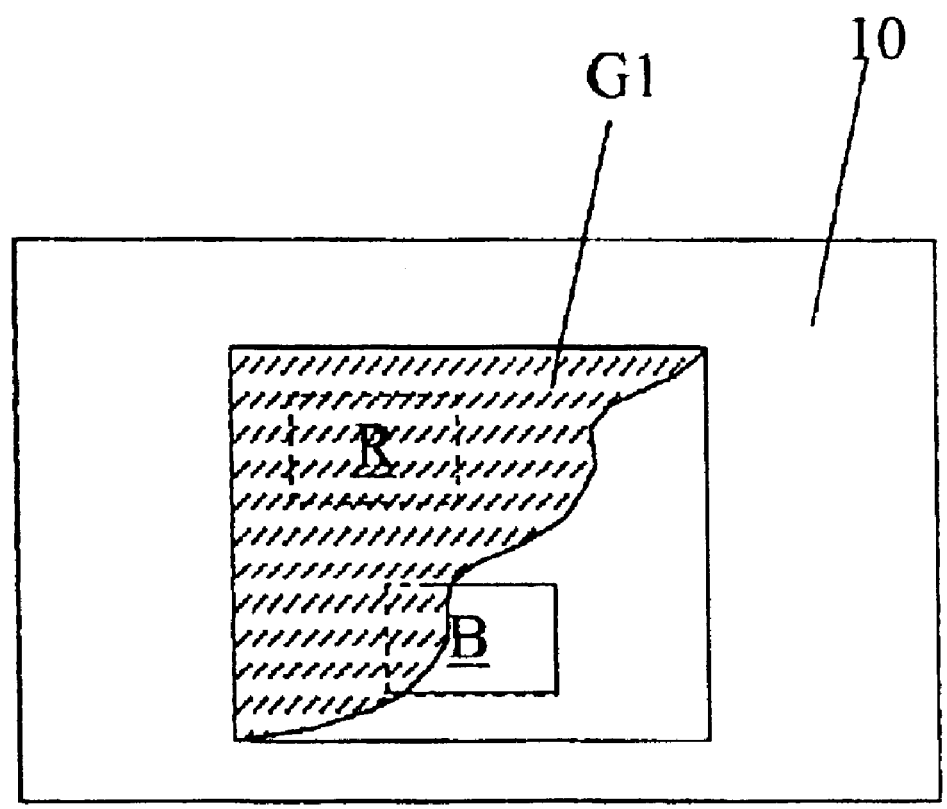
FIG. 3A shows a second embodiment of the present invention, using a red LED, a blue LED and a green phosphorescent glue.
Figure 3B:
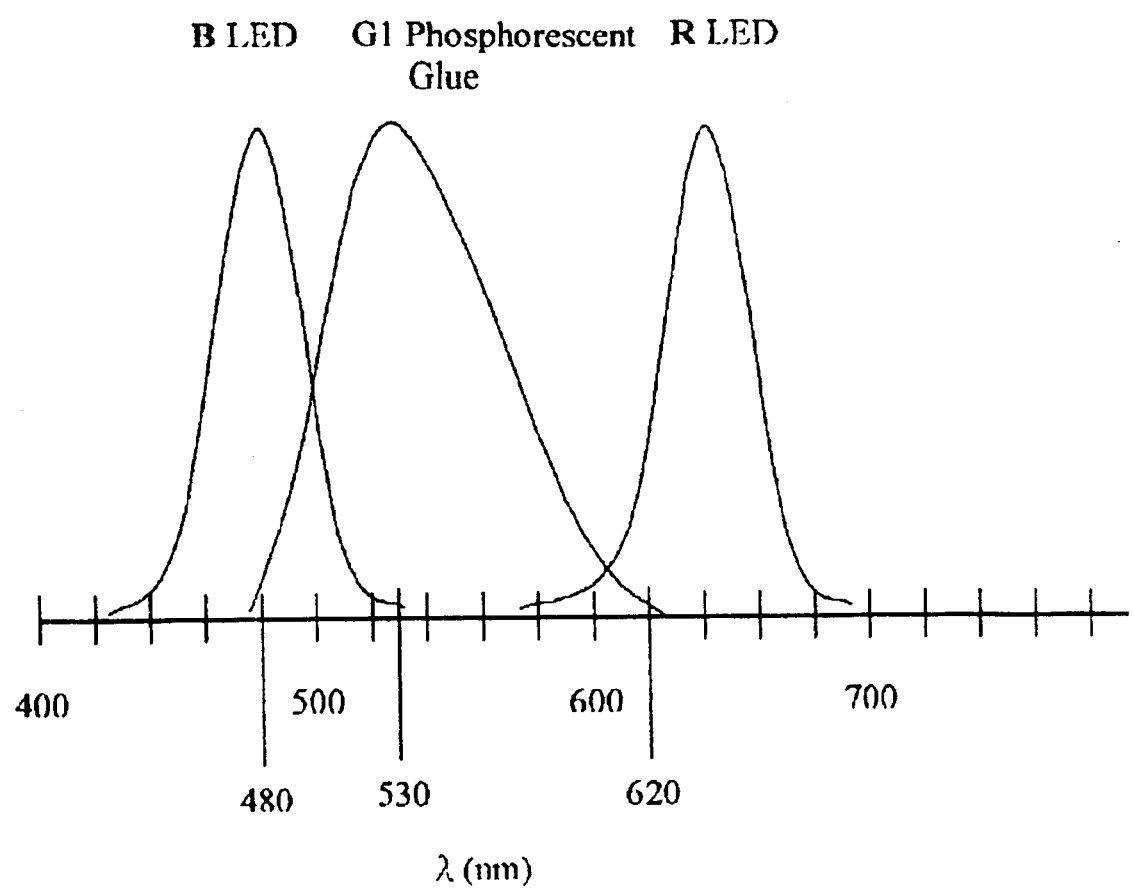
FIG. 3B shows the light spectrum of the light source shown in FIG. 3A.

FIG. 3A shows the second embodiment of the present invention. A red color LED R and a blue color LED B are mounted on a substrate 10. These two LEDs R and B are covered with a green phosphorescent glue G1. The light emitted from this structure is colorless as shown in the color spectrum in FIG. 3B. Note that the spectral response due to the green phosphorescent glue G1 complements the colors of the LEDs, and is broader then the green LED response shown in FIG. 1B. As a result, the spectral response is more uniform than that in FIG. 1B, approaching that of true natural white light.

Figure 4A:
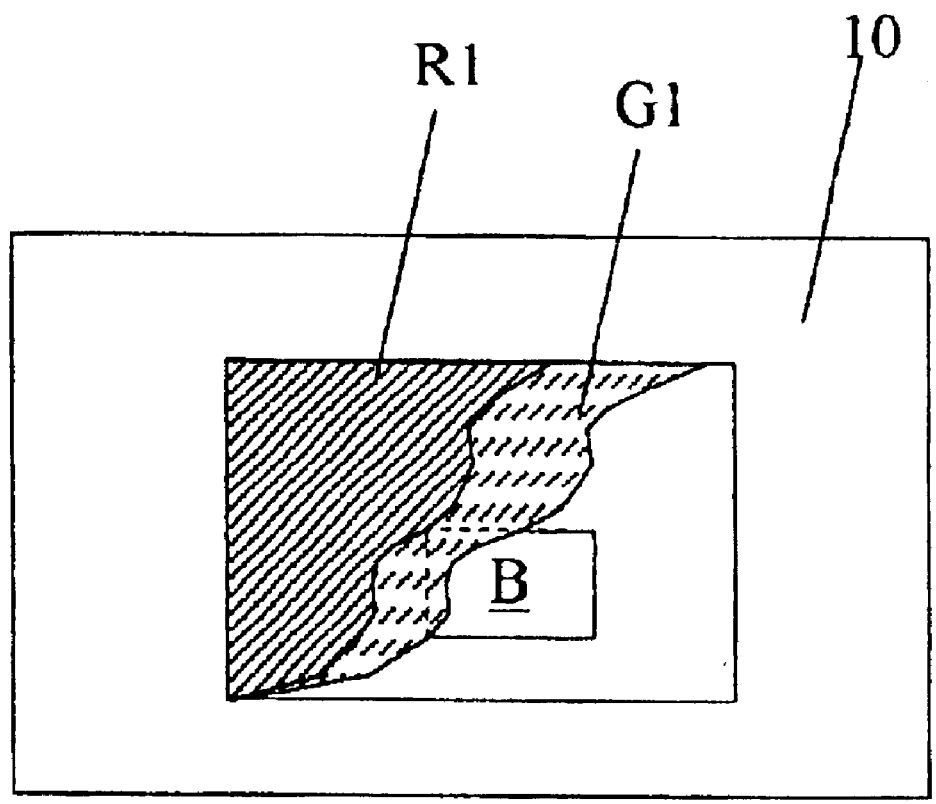
FIG. 4A shows a third embodiment of the present invention, using a blue LED, a green phosphorescent glue, and a red phosphorescent glue.
Figure 4B:
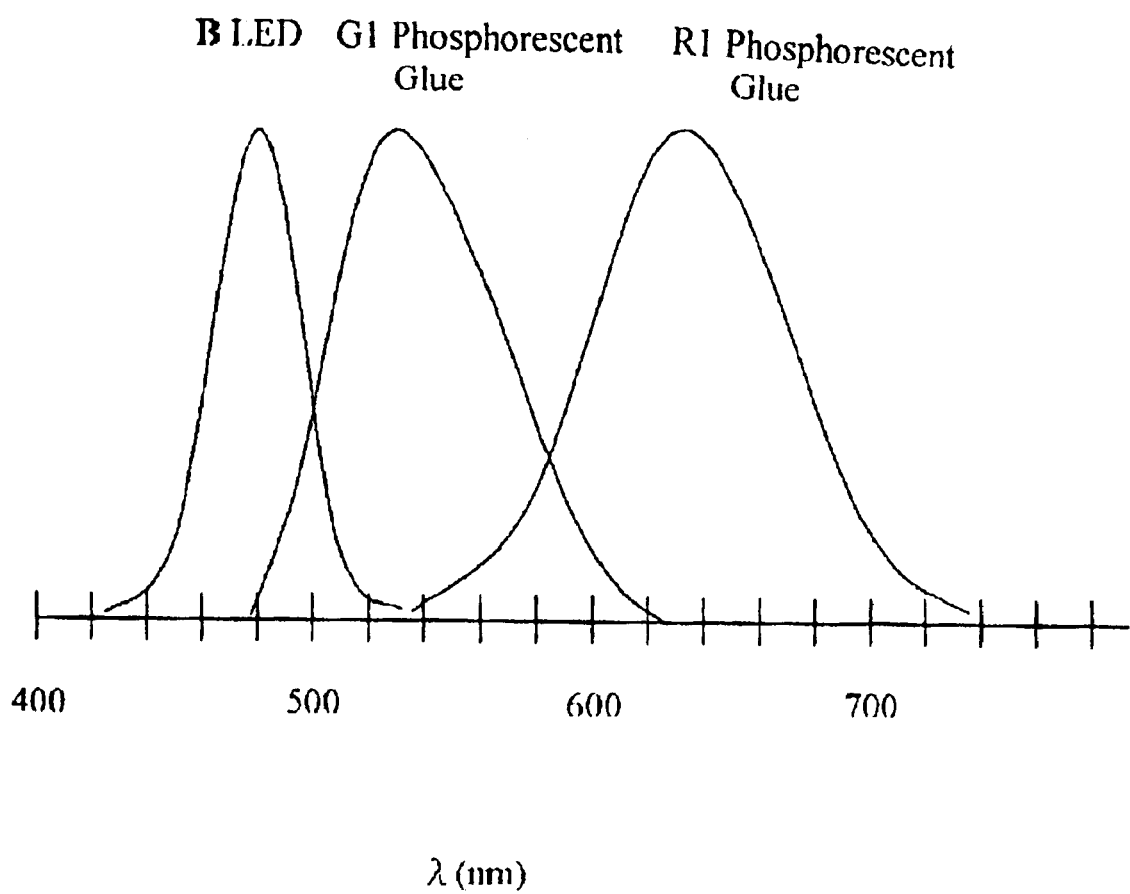
FIG. 4B shows the light spectrum of the light source shown in FIG. 4A.

FIG. 3A shows the third embodiment of the present invention. A single blue color LED B is mounted on a substrate 10. The LED B is cover with a green phosphorescent glue G1 and a red phosphorescent glue R1. The light emitted from this structure approaches that of a natural white light as shown in the spectral response in FIG. 4B. Note that responses due to the G1 phosphorescent glue and the R1 phosphorescent glue complement the color of the blue LED and are considerably broader than the corresponding green LED and red LED responses. Thus, the overall response shown in FIG. 4B is more uniform than that in FIG. 1B, approaching that of true natural light. Alternatively, a mixture of the green and red phosphorescent glue may also be used.

While the preferred embodiments of the invention have been described, it will be apparent to those skilled in the art that various modifications may be made to the embodiments without departing from the spirit of the present invention. Such modifications are all within the scope of this invention.

What is claimed is:

1. A white light source, comprising:

an insulating substrate;

a green LED and a blue LED mounted on said insulating substrate; and a red color phosphorescent glue covering said green LED and said blue LED such that the light emitted out from the phosphorescent glue is colorless and wherein the red color spectrum of the red phosphorescent glue has a wavelength range of about 550 nm to about 730 nm so that the overall spectral response approaches that of true natural white light.

* * * * *